US011062766B2

United States Patent
Siddiqui et al.

(10) Patent No.: US 11,062,766 B2
(45) Date of Patent: Jul. 13, 2021

(54) ENHANCED READ SENSING MARGIN AND MINIMIZED VDD FOR SRAM CELL ARRAYS

(71) Applicant: Synopsys, Inc., Mountain View, CA (US)

(72) Inventors: M. Sultan M. Siddiqui, Uttar Pradesh (IN); Sudhir Kumar Sharma, New Delhi (IN); Saurabh Porwal, Uttar Pradesh (IN); Khatik Bhagvan Pannalal, Gujarat (IN); Sudhir Kumar, New Delhi (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/734,201

(22) Filed: Jan. 3, 2020

(65) Prior Publication Data

US 2020/0219558 A1    Jul. 9, 2020

(30) Foreign Application Priority Data

Jan. 5, 2019 (IN) .............................. 201911000569

(51) Int. Cl.
*G11C 11/419* (2006.01)
*G11C 11/412* (2006.01)
(Continued)

(52) U.S. Cl.
CPC .............. *G11C 11/419* (2013.01); *G11C 7/12* (2013.01); *G11C 8/08* (2013.01); *G11C 8/16* (2013.01); *G11C 11/412* (2013.01)

(58) Field of Classification Search
CPC .... G11C 7/12; G11C 7/18; G11C 8/14; G11C 11/41; G11C 11/412; G11C 11/413;
(Continued)

(56) References Cited

U.S. PATENT DOCUMENTS 6,657,911 B2    12/2003  Yamaoka et al.
7,256,621 B2    8/2007   Lih et al.
(Continued)

FOREIGN PATENT DOCUMENTS

IN    201621033995 A    4/2018

OTHER PUBLICATIONS

M. Yabuuchi, et al. "A28-nm 1R1W Two-Port 8T SRAM Macro With Screening Circuitry Against Read Disturbance and Wordline Coupling Noise Failures," in IEEE Transactions on Very Large Scale Integration (VLSI) Systems, vol. 26, No. 11, pp. 2335-2344, Nov. 2018, doi: 10.1109/TVLSI.2018.2864267. (Year: 2018).*

(Continued)

*Primary Examiner* — Ajay Ojha
(74) *Attorney, Agent, or Firm* — Fenwick & West LLP

(57) ABSTRACT

A structure for an integrated circuit is disclosed for storing data. The integrated circuit includes a memory cell array of bit cells configured in a static random access memory (SRAM) architecture. The memory cell array is coupled to wordlines arranged in rows that control operations such as Read and Write operations. To enhance the read sensing margin of the SRAM configuration, the read port of a bit cell may include a wordline that drives two transistors (e.g., a PMOS and an NMOS transistor) to reduce data-dependent current leakage from a read bitline. An additional weak transistor keeper configuration may be used in the integrated circuit to compensate for current leakage from the read bitline. For example, a weak NMOS keeper that includes a sense amplifier, an inverter, and an NMOS connected to supply voltage VDD provides a path between the read bitline and VDD through the weak NMOS keeper.

20 Claims, 11 Drawing Sheets

(51) Int. Cl.
*G11C 8/16* (2006.01)
*G11C 8/08* (2006.01)
*G11C 7/12* (2006.01)

(58) Field of Classification Search
CPC .......... G11C 11/419; G11C 8/16; G11C 8/08; H01L 27/11; H01L 27/1104; H01L 27/1108
See application file for complete search history.

(56) References Cited

U.S. PATENT DOCUMENTS

| | | | |
|---|---|---|---|
| 7,672,152 | B1 | 3/2010 | Kulkarni et al. |
| 7,986,566 | B2 | 7/2011 | Houston |
| 7,986,571 | B2 | 7/2011 | Arsovski et al. |
| 9,082,465 | B2 | 7/2015 | Ganesan et al. |
| 9,165,642 | B2 | 10/2015 | Kumar |
| 9,460,777 | B2 | 10/2016 | Jung et al. |
| 9,465,905 | B1 | 10/2016 | Arie et al. |
| 2017/0345485 | A1 | 11/2017 | Sinangil et al. |

OTHER PUBLICATIONS

Birla, S. et al., "Static Noise Margin Analysis of Various SRAM Topologies," IACSIT International Journal of Engineering and Technology, Jun. 2011, pp. 304-309, vol. 3, No. 3.

Calhoun, B. H. et al., "A 256-kb 65-nm Sub-threshold SRAM Design for Ultra-Low-Voltage Operation," IEEE Journal of Solid-State Circuits, Mar. 2007, pp. 680-688, vol. 42, No. 3.

Chang, J. et al., "A 20nm 112Mb SRAM in High-k Metal-Gate with Assist Circuitry for Low-Leakage and Low-$V_{min}$ Applications," 2013 IEEE International Solid-State Circuits Conference, Feb. 20, 2013, three pages.

Chang, L. et al., "An 8T-SRAM for Variability Tolerance and Low-Voltage Operation in High-Performance Caches," IEEE Journal of Solid-State Circuits, Apr. 2008, pp. 956-963, vol. 43, No. 4.

Chen, C.-F. et al., "A 210mV 7.3MHz 8T SRAM with Dual Data-Aware Write-Assists and Negative Read Wordline for High Cell-Stability, Speed and Area-Efficiency," 2013 Symposium on VLSI Circuits Digest of Technical Papers, Jun. 2013, pp. C130-C131.

Jeon, D. et al., "A 23mW Face Recognition Accelerator in 40nm CMOS with Mostly-Read 5T Memory," IEEE Symposium on VLSI Circuits, Jun. 17-19, 2015, pp. C48-C49, Kyoto, Japan.

Kim, T.-H. et al., "A Voltage Scalable 0.26V, 64 kb 8T SRAM with $V_{min}$ Lowering Techniques and Deep Sleep Mode," IEEE Journal of Solid-State Circuits, Jun. 2009, pp. 1785-1795, vol. 44, No. 6.

Kulkarni, J. P. et al., "5.6 Mb/mm$^2$ 1R1W 8T SRAM Arrays Operating Down to 560 mV Utilizing Small-Signal Sensing With Charge Shared Bitline and Asymmetric Sense Amplifier in 14 nm FinFET CMOS Technology," IEEE Journal of Sold-State Circuits, Jan. 2017, pp. 229-239, vol. 52, No. 1.

Rukkumani, V., "Chapter 2: Design of SRAM Cell Using Transistors (in Design and Analysis of 8T/10TSRAM Cells for Power Reduction Using Low Power Techniques: A Thesis)," Anna University Faculty of Electrical Engineering, Sep. 2015, 37 pages, [Online] [Retrieved on Mar. 23, 2020], Retrieved from the Internet<URL: shodhganga.inflibnet.ac.in/bitstream/10603/141452/10/10_chapter%202.pdf> (with title page and table of contents).

Siddiqui, M.-S.-M. et al. "A 10T SRAM cell with Enhanced Read sensing margin and Weak NMOS Keeper for Large Signal Sensing to Improve VDDMIN," IEEE International Symposium on Circuits and Systems (ISCAS), May 26-29, 2019, five pages, Sapporo, Japan.

Song, T. et al., "A 14nm FinFET 128 Mb 6T SRAM with $V_{min}$ Enhancement Techniques for Low-Power Applications," IEEE Journal of Solid-State Circuits, Jan. 2015, pp. 158-169, vol. 50, No. 1.

Verma, N. et al., "A 65nm 8T Sub-Vt SRAM Employing Sense-Amplifier Redundancy," IEEE International Solid-State Circuits Conference, Feb. 13, 2007, three pages.

Wang, A. et al., "A 180-mV Subthreshold FFT Processor Using a Minimum Energy Design Methodology," IEEE Journal of Solid-State Circuits, Jan. 2005, pp. 310-319, vol. 40, No. 1.

Wu, J.-J. et al., "A large $\sigma V_{TH}$/VDD Tolerant Zigzag 8T SRAM With Area-Efficient Decoupled Differential Sensing and Fast Write-Back Scheme", 2010 Symposium on VLSI Circuits/Technical Digest of Technical Papers, Jun. 2010, pp. 103-104.

Yang, B.-D. et al., "A Low-Power SRAM Using Hierarchical Bit Line and Local Sense Amplifiers," IEEE Journal of Solid-State Circuits, Jun. 2005, pp. 1366-1376, vol. 40, No. 6.

Yeoh, Y. L. et al., "A 0.4V 7T SRAM with Write Through Virtual Ground and Ultra-fine Grain Power Gating Switches," IEEE International Symposium on Circuits and Systems (ISCAS), May 19-23, 2013, pp. 3030-3033, Beijing, China.

Zeinolabedin, S. M. A. et al., "A 128-Channel Spike Sorting Processor Featuring μW and 0.0033 mm$^2$ per Channel in 65-nm CMOS," 2016 Symposium on VLSI Circuits Digest of Technical Papers, Jun. 2016, one page.

PCT International Search Report and Written Opinion, PCT Application No. PCT/US2020/012261, dated Apr. 23, 2020, 17 pages.

* cited by examiner

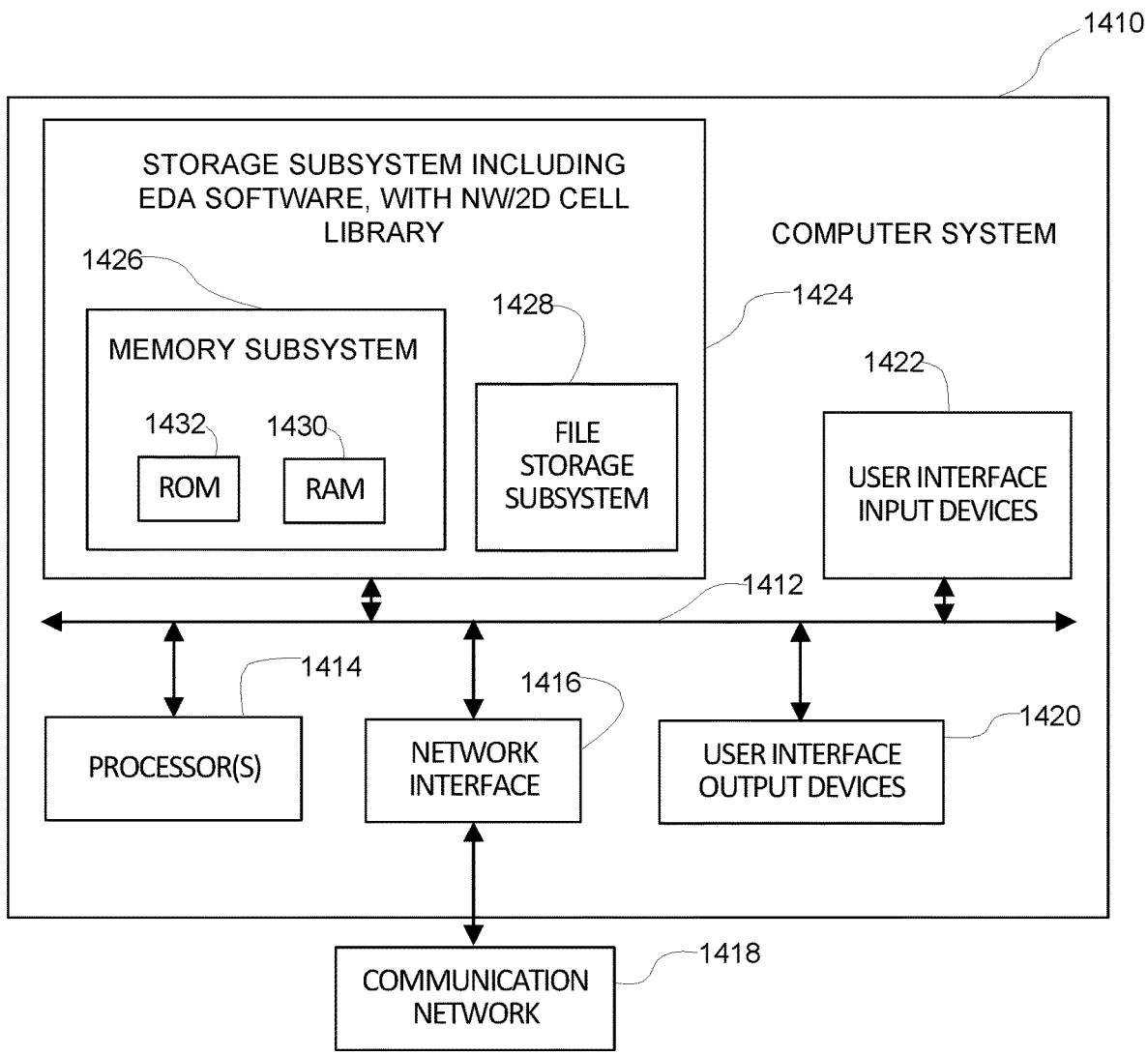
FIG. 14A
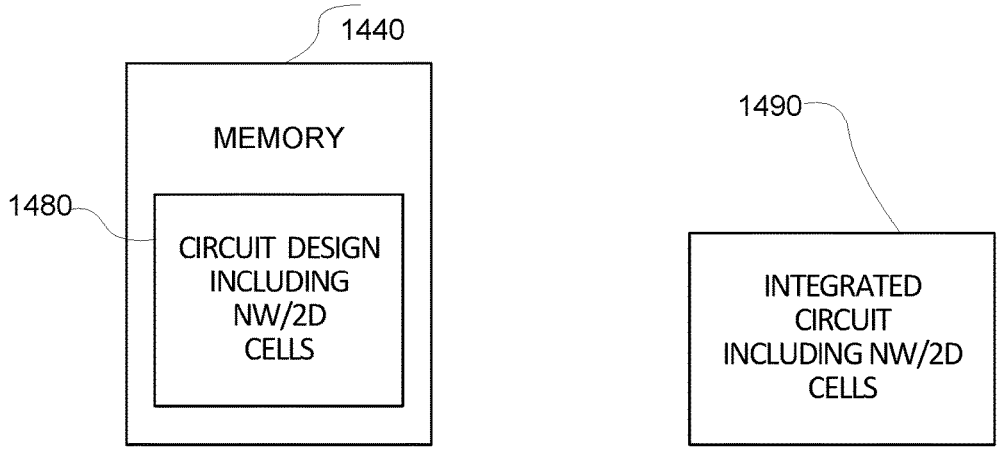
FIG. 14B
FIG. 14C

ENHANCED READ SENSING MARGIN AND MINIMIZED VDD FOR SRAM CELL ARRAYS

CROSS REFERENCE TO RELATED APPLICATIONS

This application claims the right of priority based on Indian application serial no. 201911000569, filed Jan. 5, 2019, which is incorporated by reference in its entirety.

TECHNICAL FIELD

The disclosure generally relates to the field of memory cells and in particular to Static Random Access Memory (SRAM).

BACKGROUND

System on chip (SOC) designs are widely used in consumer electronics due to their lower power consumption and smaller form factors. Such advantages promote SOC design applications in wearable devices, Internet of Things (IoT) products, and medical devices. SOC systems are designed to be energy efficient to maximize system lifetime. Operation at a minimum energy point may be achieved by dynamic voltage scaling to a lower supply voltage. In present SOCs, SRAM occupies significant circuit area and expends large amounts of power and energy. For example, conventional six-transistor (6T) SRAMs do not operate optimally in ultra-low voltages due to degradation in design parameters such as Static Noise Margin (SNM), poor read and write margins, and exponentially increased sensitivity to process-voltage-temperature (PVT) fluctuation.

While eight-transistor (8T) SRAM cells with a separated read port for decoupled read and write operations have been designed for improved operation in ultra-low voltage applications with increased cell stability, these 8T SRAM cell designs can suffer data-dependent Read Bitline (RBL) leakage through its read port. RBL leakage deteriorates the read sensing margin of the 8T SRAM cell by minimizing the voltage and time window (e.g., due to small on-off current ratios at ultra-low voltages). Decoupled SRAM cells have also been designed such that their RBL sensing margins are boosted. For example, 10-transistor (10T) SRAM cells have been designed to inject a leakage current from unselected cells to the RBL, independent of the data stored, to improve sensing margin. However, this specific 10T SRAM design suffers a Read '0' delay degradation due to the stack of three N-type metal-oxide-semiconductors (NMOS) in the Read '0' discharging path.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

FIGS. 14A-14C depict block diagrams of a computer system suitable for use with embodiments of the technology, as well as circuit design and circuit embodiments of the technology, according to at least one embodiment.

DETAILED DESCRIPTION

Figure 1:
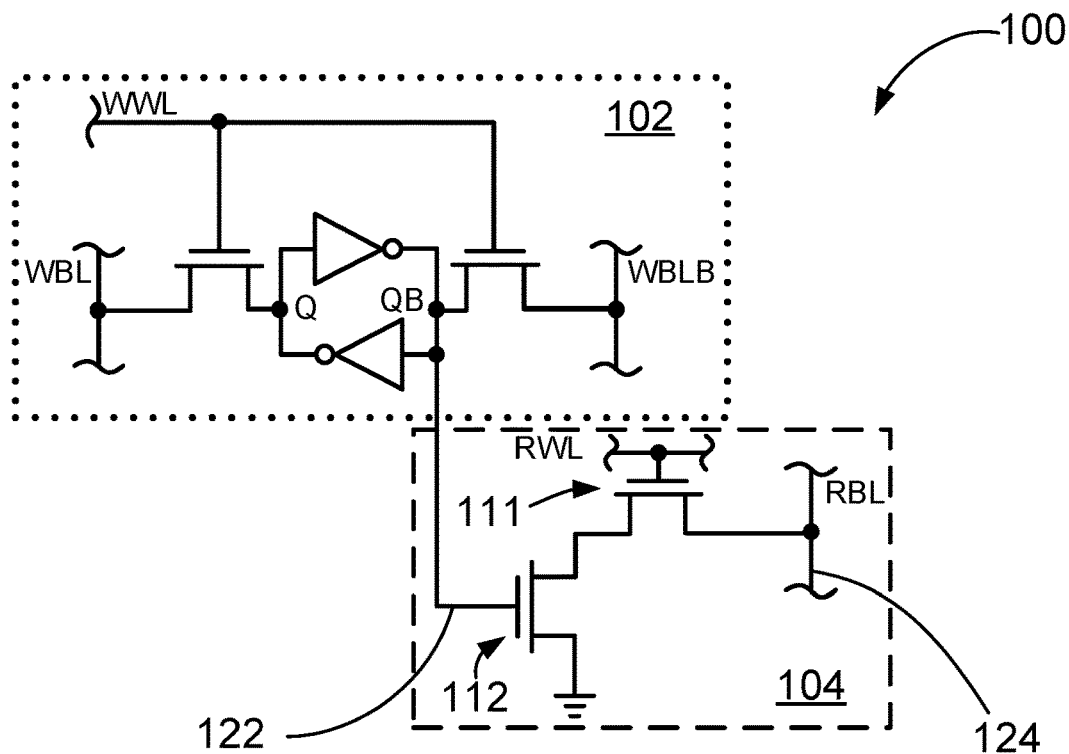
FIG. 1 depicts a circuit diagram illustrating an 8T SRAM cell, according to at least one embodiment.

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Circuit Configuration Overview

One embodiment of a disclosed system, method and computer readable storage medium includes data-independent current leakage to improve read sensing margin in an SRAM cell and compensation of current leakage through a weak NMOS keeper that also reduces the minimum supply voltage necessary to operate the SRAM cell. A "cell" or "bit cell" as referred to herein, refers to a portion of an integrated circuit in which a single bit is stored.

FIG. (FIG.) 1 depicts a circuit diagram illustrating 8T SRAM cell 100. 8T SRAM cell 100 includes write port 102 and read port 104. Write port 102 contains data storage for values Q and QB (i.e., "Q bar"), where QB is the inverse of Q. Read port 104 is decoupled (e.g., RBL 124 of read port 104 is separated from the Write Bitline (WBL) of write port 202) to reduce the likelihood that read operations disturb the currents traveling into data storage nodes, improving the static noise margin. Read port 104 includes transistors 111 and 112. Transistor 111 is coupled to a Read Wordline (RWL), transistor 112, and RBL 124 such that when RWL='0' (i.e., the logic value on the RWL is zero), the read port is operating in a standby condition and when RWL='1,' read port 104 is operating in a read condition. In the standby condition, transistor 111 is at an 'OFF' state and data QB is not driven onto RBL 124. In the read condition, transistor 111 is at an 'ON' state and data QB is driven onto RBL 124. Transistor 112 is coupled to transistor 111, a data storage node (e.g., the data storage node associated with data value QB) through path 122, and a common ground such that when QB='0,' transistor 112 is OFF and when QB='1,' transistor 112 is ON. In some embodiments, transistors 111 and 112 are NMOS transistors.

Before a read operation, RBL is precharged to logic value '1.' During a read operation, transistor 111 is ON and the value of QB is driven onto RBL 124. An operation to read Q='0' is referred to herein as "RBL Read '0.'" For RBL Read '0,' QB, as the inverse of Q, is '1,' causing transistor 112 to be ON. With both transistors 11 and 112 ON, the charge on RBL is discharged to the common ground. A logic value of '0' may be determined based on the discharge. An operation to read Q='1' is referred to herein as "RBL Read '1.'" For RBL Read '1,' QB is '0,' causing transistor 112 to be OFF. With transistor 111 ON and transistor 112 OFF, the charge on RBL 124, in some embodiments, does not discharge to the common ground and a logic value of '1' is determined based on the charge maintained on RBL 124.

Figure 2:
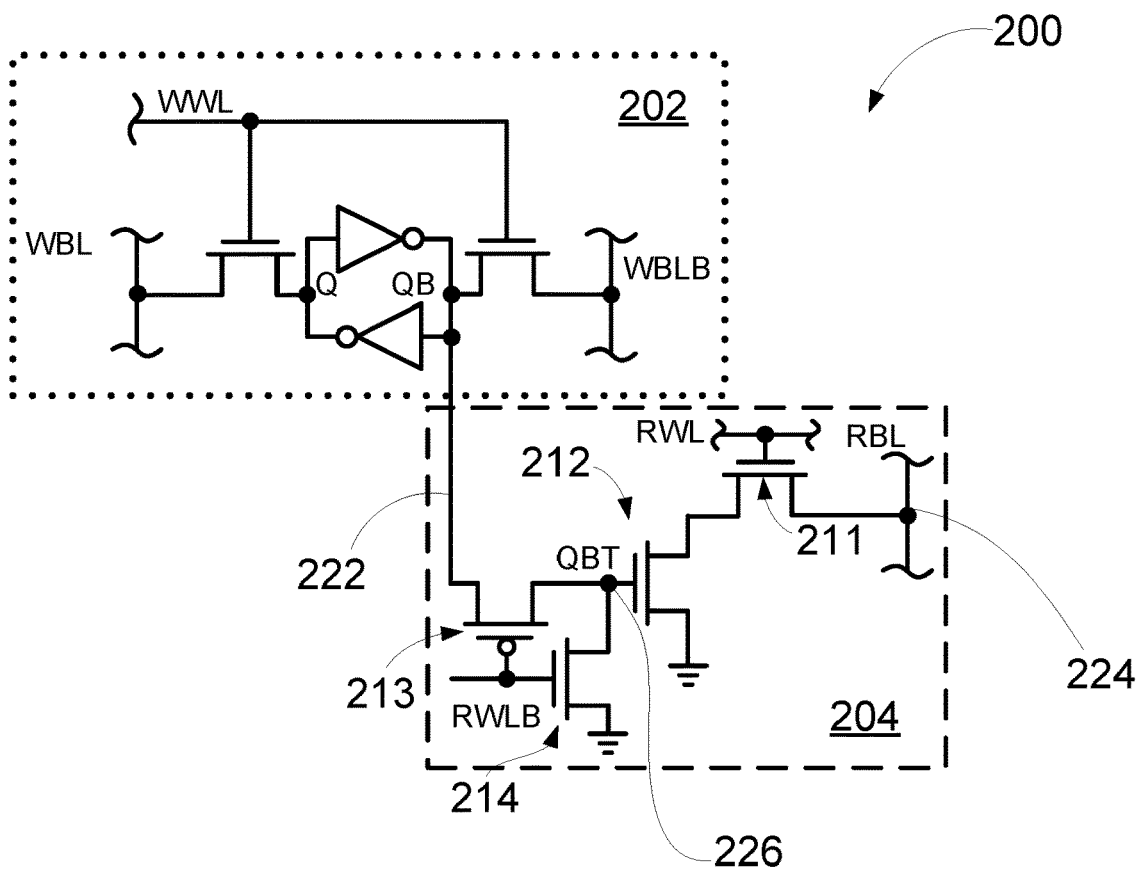
FIG. 2 depicts a circuit diagram illustrating a 10T SRAM cell, according to at least one embodiment.

FIG. 2 depicts a circuit diagram illustrating 10T SRAM cell 200. 10T SRAM cell 200 includes write port 202 and read port 204. Write port 202 contains data storage for values Q and QB (i.e., "Q bar"), where QB is the inverse of Q. Read port 204, similar to read port 104 of 8T SRAM cell 100, is decoupled (e.g., RBL 224 of read port 204 is separated from the Write Bitline (WBL) of write port 202) to reduce the likelihood that read operations disturb the currents traveling into data storage nodes, improving the static noise margin. Read port 204 is a 4-transistor (4T) read port that includes transistors 211-214. 10T SRAM cell 200 includes additional transistors 213 and 214 in its configuration compared to the configuration of 8T SRAM cell 100. Transistor 211 is coupled to a RWL, transistor 212, and RBL 224. Transistor 212 is coupled to transistor 211, transistor 213, and a common ground. Transistor 213 is coupled to Read Wordline Bar (RWLB), a data storage node (e.g., the data storage node associated with data value QB) through path 222, transistor 212, and transistor 214. Transistor 214 is coupled to RWLB, transistor 212, transistor 213, and a common ground. In some embodiments, transistors 211, 212, and 214 are NMOS transistors and transistor 213 is a PMOS transistor. The configuration of transistor 211 is designed to enable standby and read operations such that when RWL='0,' read port 204 is operating in a standby condition and when RWL='1,' read port 204 is operating in a read condition. When RWL='0,' Read Wordline Bar (RWLB)='1' because its value is the inverse of the value of RWL. Therefore, in the standby condition, transistor 211 is at 'OFF,' transistor 213 is 'OFF,' transistor 214 is 'ON,' and data QBT is not driven onto RBL 224. In the read condition, transistor 211 is 'ON' and data QBT is driven onto RBL 224 (e.g., QBT is driven to common ground because transistor 214 is 'ON').

Figure 4:
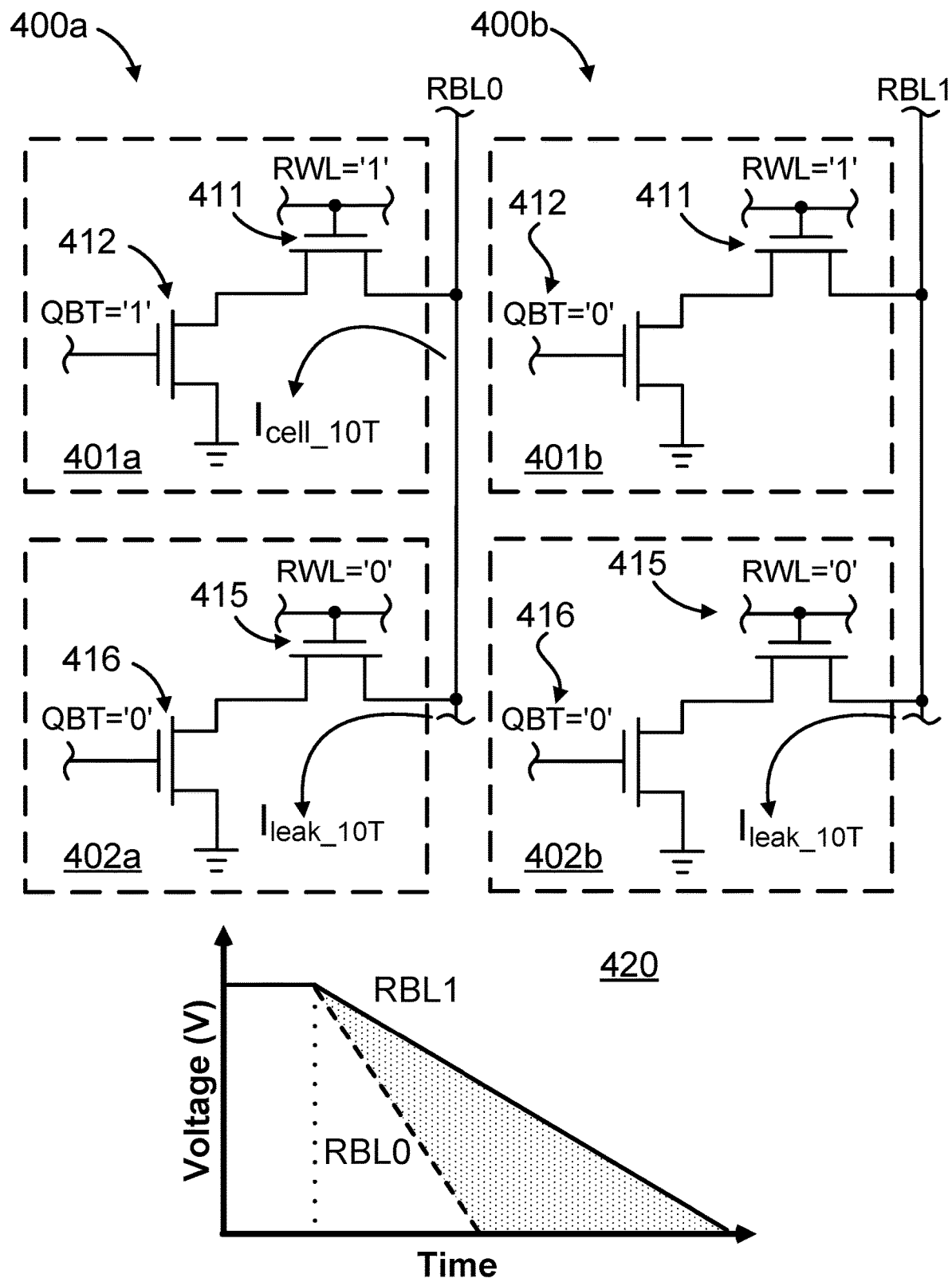
FIG. 4 shows the principle of RBL sensing for a 10T SRAM cell through two read operation embodiments, according to at least one embodiment.

In some embodiments, the configuration of transistors 213 and 214, as described in the description of FIG. 4, allows for data-independent leakage current in read port 204 through a configuration that drives transistor 212 with QBT rather than with QB. Due to the configuration similarities between transistors 111 and 112 in 8T SRAM cell 100 and transistors 211 and 212 in 10T SRAM cell 200, read port 204 is capable of a similar RBL discharge as 8T SRAM cell 100 is. However, to drive transistors 212 and 213, the extra RWLB signal is routed for data-independent RBL discharge and reduces the maximum leakage of read port 204 compared to the maximum leakage of read port 104 during standby operations.

Performance Analysis of Circuit Configurations

Figure 3:
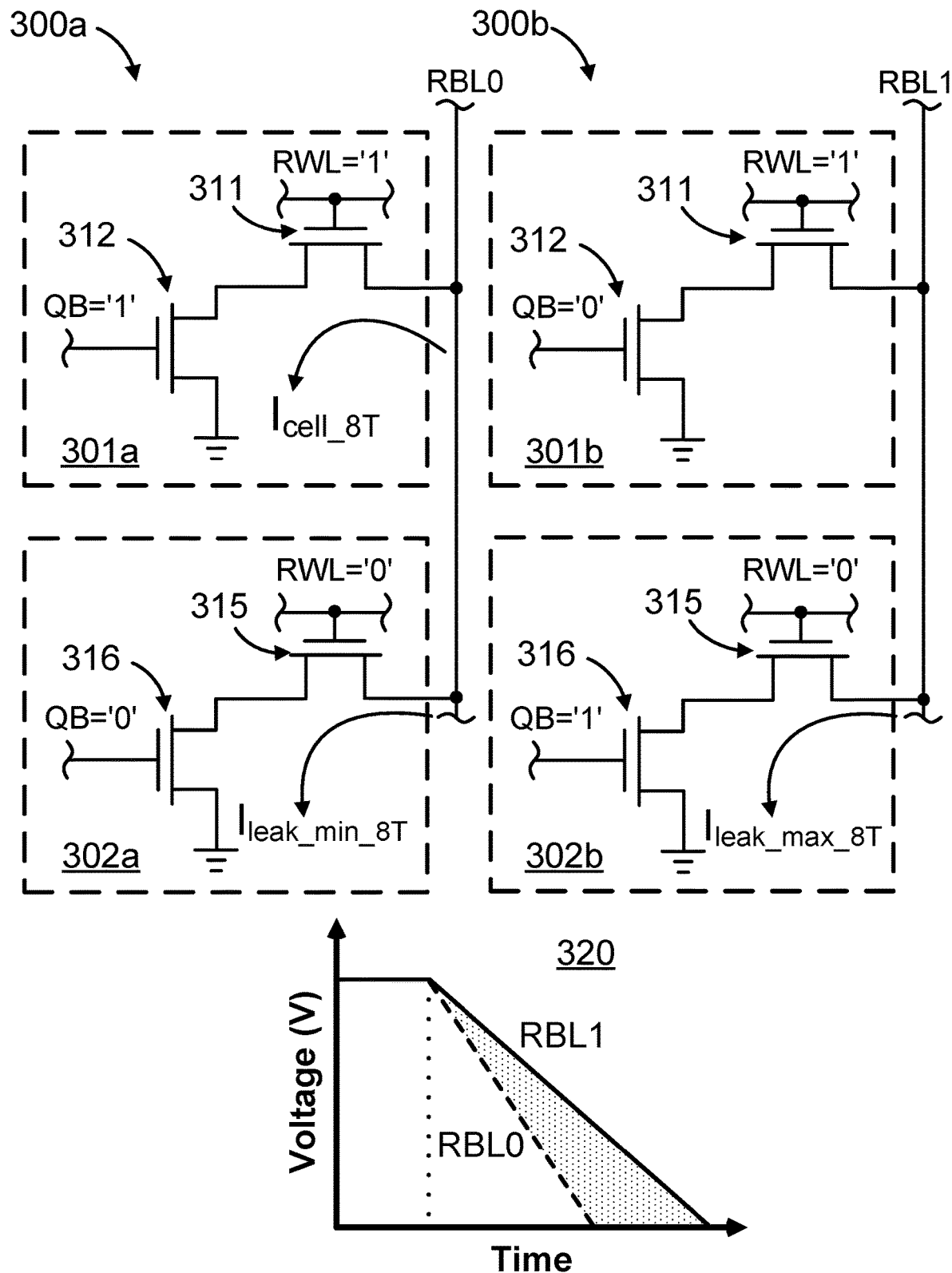
FIG. 3 shows the principle of RBL sensing for an 8T SRAM cell through two read operation embodiments, according to at least one embodiment.

FIG. 3 shows the principle of RBL sensing for 8T SRAM cells through two read operation embodiments. Read operation embodiments 300a and 300b show data-dependent current leakage scenarios for an 8T SRAM cell array (e.g., current leakage is dependent on the data held in an unselected cell). Read operation embodiment 300a shows a value of '0' (e.g., Q='0' and QB='1') read onto the RBL, denoted as 'RBL0' to correspond to the read value. Read operation embodiment 300b shows a value of '1' (e.g., Q='1' and QB='0') read onto the RBL, denoted as 'RBL1' to correspond to the read value. The two-transistor (2T) read ports 301a, 302a, 301b, and 302b correspond to SRAM cells that are coupled, though not depicted in FIG. 3, to respective write ports that includes respective data storage nodes (e.g., data storage nodes for Q and QB). Read ports 301a and 302a are the same read ports as 301b and 302b, respectively, but have different signals applied at the gates of the transistors depending on the data held within cells of the array for the different read operation embodiments. Accordingly, the configuration described using read port 301a and 302a apply for like numerals for read ports 301b and 302b. Read port 301a includes transistors 311a and 312a that are configured similar to the configuration of transistors 111 and 112. Read port 302a includes transistors 315a and 316a that are also configured similar to the configuration of transistors 111 and 112. As depicted in FIG. 3, read ports 301a and 301b correspond to selected cells and read ports 302a and 302b correspond to unselected cells (e.g., the RBL is reading a value from a selected cell and not from unselected cells).

During read operation embodiment 300a, the selected cell is holding a value of QB='1' and the unselected cell is holding a value of QB='0.' RBL0 is precharged to logic value '1' and is reading QB='1' (i.e., Q='0'). Transistors 311a and 312a are 'ON' and RBL0 is discharged to '0' through current $I_{cell\_8T}$. Although the unselected cell is holding a value of QB='0' and the RWL is '0' to enable standby operation for the unselected cell, a minimal leakage current, $I_{leak\_min\_8T}$, is discharging from RBL0 through transistors 315a and 316a. The minimal leakage notation is used to reflect that minimum leakage from a read port occurring when both RWL is '0' and QB is '0,' turning 'OFF' the corresponding transistors (e.g., transistors 315a and 316a). Accordingly, during read operation embodiment 300a, a total current discharging from RBL0 is $I_{cell\_8T}$+ $I_{leak\_min\_8T}$. Read operation embodiment 300a may reflect a conditionally, worst-case read '0' operation (i.e., a data-dependent current leakage when QB='0' at unselected cells).

During read operation embodiment 300b, the selected cell is holding a value of QB='0' and the unselected cell is holding a value of QB='1.' RBL1 is precharged to logic value '1' and is reading QB='0' (i.e., Q='1'). Transistor 311b is 'ON,' transistor 312b is 'OFF,' and RBL1 is pulled up by the value of RWL='1' such that a logic value of '1' can be maintained on RBL1. Although transistor 315b is 'OFF,' a leakage current exists through transistor 315b and through the 'ON' transistor 316b. This leakage current, $I_{leak\_max\_8T}$, is a maximum leakage current through an unselected cell. Accordingly, during read operation embodiment 300b, a total current discharging from RBL1 is $I_{leak\_max\_8T}$. In some embodiments, $I_{leak\_max\_8T}$ depends on the number of unselected cells connected to the RBL. Read operation embodiment 300b may reflect a conditionally, worst-case read '1' operation (i.e., a data-dependent current leakage when QB='1' at unselected cells).

In some embodiments, the data-dependent current leakage limits the maximum number of bit cells per RBL and causes a small RBL sensing margin. Graph 320 depicts the RBL sensing margin of an 8T SRAM cell array over time. The voltage differential between the charge on RBL0 and RBL1 is represented on the y-axis while time is represented on the x-axis. In some embodiments, the RBL sensing margin is determined based upon the current differential RBL0−RBL1 or $(I_{cell\_8T}+I_{leak\_min\_8T})-(I_{leak\_max\_8T})$. In graph 320, the voltage of RBL0 over time is depicted as a dashed line while the voltage over time of RBL1 is depicted as a solid line. The dotted, vertical line represents the time when the RWL is switched from '0' to '1.' For a 10T SRAM cell array, as described in the description of FIG. 4, the RBL sensing margin increases from that of the margin of the 8T SRAM cell array due to the additional two transistors driven by the extra RWLB signal.

FIG. 4 shows the principle of RBL sensing for 10T SRAM cells through two read operation embodiments. Read operation embodiments 400a and 400b show data-independent current leakage scenarios for an 10T SRAM cell array (e.g., current leakage is independent on the data held in an unselected cell). Read operation embodiment 400a shows a value of '0' (e.g., Q='0' and QB='1') read onto the RBL, denoted as 'RBL0' to correspond to the read value. Read operation embodiment 400b shows a value of '1' (e.g., Q='1' and QB='0') read onto the RBL, denoted as 'RBL1' to correspond to the read value. The 2T read ports 401a, 402a, 401b, and 402b correspond to SRAM cells that are coupled, though not depicted in FIG. 4, to respective 'QBT' nodes connected to the additional PMOS and NMOS transistor of the 10T SRAM memory cell configuration (e.g., transistors 213 and 214). Read ports 401a and 402a are the same read ports as 401b and 402b, respectively, but have different signals applied at the gates of the transistors depending on the data held within cells of the array for the different read operation embodiments. Accordingly, the configuration described using read port 401a and 402a apply for like numerals for read ports 401b and 402b. Read port 401a includes transistors 411a and 412a that are configured similar to the configuration of transistors 111 and 112. Read port 402a includes transistors 415a and 416 that are also configured similar to the configuration of transistors 111 and 112. Transistor 416 in an unselected cell is driven by QBT='0' during standby operations because of, though not depicted in FIG. 4, the RWLB and additional two transistors. Because transistor 416 is always 'OFF' during standby operations, there is no data-dependent current leakage. For example, the current leakages in different, unselected cells are the same regardless of what data value is held by the respective, unselected cells. As depicted in FIG. 4, read ports 401a and 401b correspond to selected cells and read ports 402a and 402b correspond to unselected cells (e.g., the RBL is reading a value from a selected cell and not from unselected cells).

During read operation embodiment 400a, the selected cell is holding a value of QB='1' and the unselected cell is holding a value of QB='0.' RBL0 is precharged to logic value '1' and is reading QB='1' (i.e., Q='0'). Transistors 411a and 412a are 'ON' and RBL0 is discharged to '0' through current $I_{cell\_10T}$. Although the unselected cell is holding a value of QB='0' and the RWL is '0' to enable standby operation for the unselected cell, a minimal leakage current, $I_{leak\_10T}$, is discharging from RBL0 through transistors 415a and 416. Accordingly, during read operation embodiment 400a, a total current discharging from RBL0 is $I_{cell\_10T}+I_{leak\_10T}$.

During read operation embodiment 400b, the selected cell is holding a value of QB='0' and the unselected cell is holding a value of QB='1.' RBL1 is precharged to logic value '1' and is reading QB='0' (i.e., Q='1'). Transistor 411b is 'ON,' transistor 412b is 'OFF,' and RBL1 is pulled up by the value of RWL='1' such that a logic value of '1' can be maintained on RBL1. Although transistor 415b is 'OFF,' a leakage current, $I_{leak\_10T}$, exists through transistor 415b and through the 'ON' transistor 416. Accordingly, during read operation embodiment 400b, a total current discharging from RBL1 is $I_{leak\_10T}$. In some embodiments, $I_{leak\_10T}$ depends on the number of unselected cells connected to the RBL.

Graph 420 depicts the RBL sensing margin of an 10T SRAM cell array over time. Similar to graph 320, voltage differential between the charge on RBL0 and RBL1 is represented on the y-axis of graph 420 while time is represented on the x-axis. In some embodiments, the RBL sensing margin is determined based upon the current differential RBL0−RBL1 or $(I_{cell_{10T}}+I_{leak_{10T}})-(I_{leak_{10T}})=I_{cell_{10T}}$. In some embodiments, $I_{cell_{10T}}$ is similar to $I_{cell_{8T}}$. The RBL sensing margin for a 10T SRAM cell array is larger than the RBL sensing margin for an 8T SRAM cell array. There may be less constraint on the maximum number of bit cells per RBL because there is no data-dependent current leakage in a 10T SRAM cell array.

Performance Analysis of Circuit Configurations

Referring now to FIGS. 5 through 8, illustrated are graphs comparing the performance of an 8T SRAM cell array configuration and a 10T cell array configuration.

Figure 5:
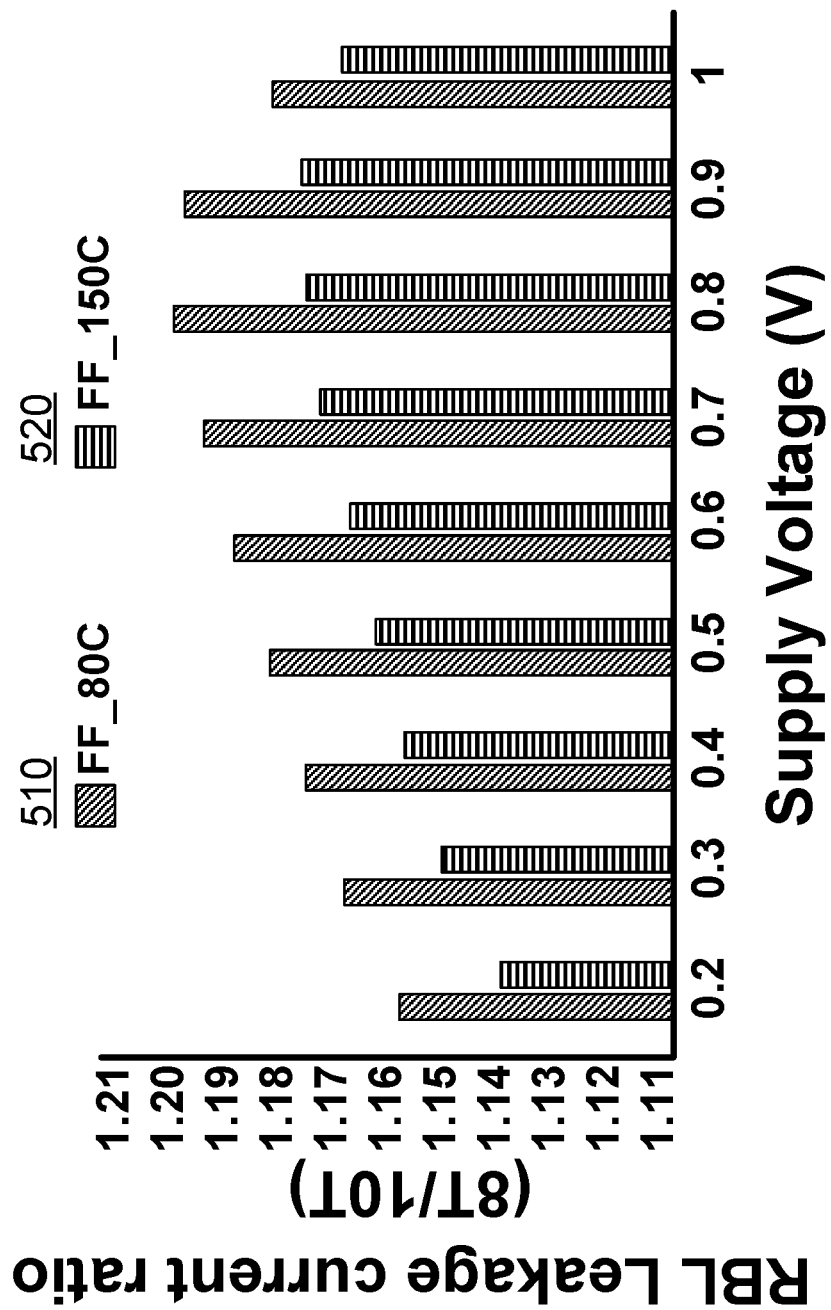
FIG. 5 is a graph illustrating an 8T SRAM and 10T SRAM RBL leakage current ratio as a function of supply voltage, according to at least one embodiment.

FIG. 5 is a graph illustrating an 8T SRAM and 10T SRAM leakage current ratio as a function of supply voltage. The data of FIG. 5 may be obtained using a simulation scenario having a read '1' operation, a process corner of Fast NMOS and Fast PMOS (FF), temperatures of 80° C. and 150° C., QB='1' for an unselected read port of the 8T SRAM, and QBT='0' for an unselected read port of the 10T SRAM. Simulations can be run on software such as a Synopsys HSPICE Simulator to obtain the shown RBL leakage for 8T and 10T SRAM cells operating at different operating voltages 0.2V through 1V with a step of 0.1V. The leakage ratios at 80° C. are shown in data set 510 and the leakage ratios at 150° C. are shown in data set 520. The current leakage ratios of data set 510 are higher than the ratios of 520. For each incremental supply voltage, the RBL leakage current for the 10T SRAM cell improves by approximately 15% compared to the RBL leakage current for the 8T SRAM cell.

Figure 6:
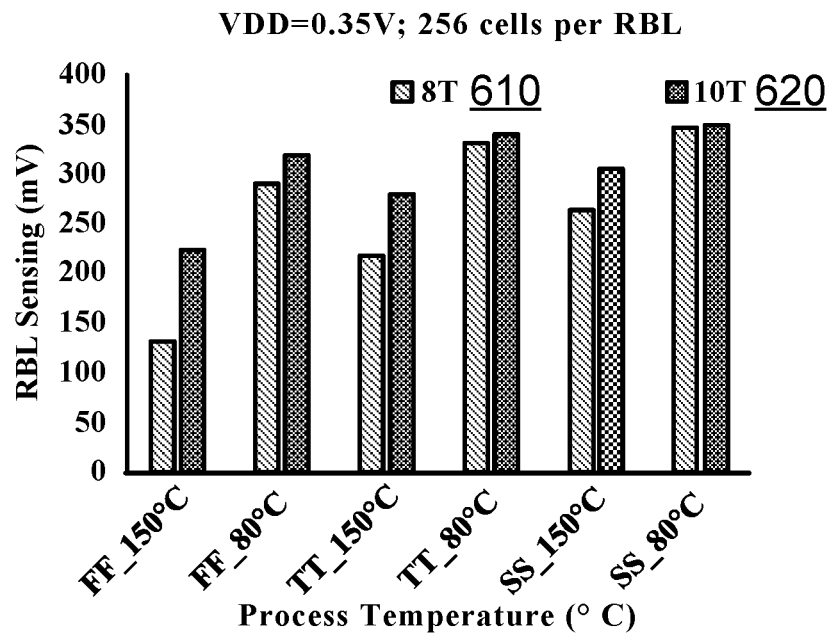
FIG. 6 is a graph illustrating the RBL sensing margin of 8T SRAM and 10T SRAM cell configurations based at least on temperature, according to at least one embodiment.

FIG. 6 is a graph illustrating the RBL sensing margin of 8T SRAM and 10T SRAM cell configurations based at least on temperature. A simulation setup with 256 cells per RBL and a supply voltage, VDD, of 0.35V can be used to obtain the simulation results shown in the graph of FIG. 6. Dataset 510 corresponds to the RBL sensing performance of an 8T SRAM cell configuration and dataset 520 corresponds to the RBL sensing performance of a 10T SRAM cell configuration. Three process corners are compared in combination with the 8T and 10T SRAM configurations: FF, Typical NMOS Typical PMOS (TT), and Slow NMOS Slow PMOS (SS). In some embodiments, the 10T SRAM cell array achieves improved RBL sensing margin at certain process corners and temperatures. For example, at process corner Fast NMOS Fast PMOS (FF) and temperature 150° C., which can be a worst-case scenario for RBL leakage, the RBL sense margin can improve approximately 100 mV for 10T SRAM cell arrays compared to 8T SRAM cell arrays.

Figure 7:
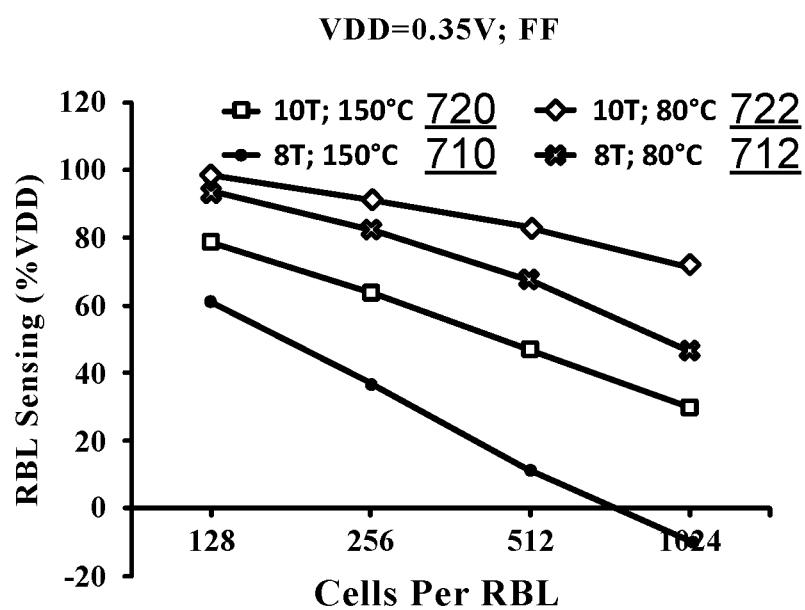
FIG. 7 is a graph illustrating the RBL sensing margin of 8T SRAM and 10T SRAM cells based at least on the number of cells per RBL, according to at least one embodiment.

FIG. 7 is a graph illustrating the RBL sensing margin of 8T SRAM and 10T SRAM cells based at least on the number of cells per RBL. The RBL sensing margin is shown as a percentage of supply voltage, VDD. A simulation setup with a VDD of 0.35V and FF process corner can be used to obtain the simulation results shown in the graph of FIG. 7. The RBL sensing margin in 10T SRAM at 150° C. data set 720 has an approximate improvement of 30% VDD over the RBL sensing margin in 8T SRAM at 150° C. data set 710. The RBL sensing margin in 10T SRAM at 80° C. data set 722 has an approximate improvement of 15% over the RBL sensing margin in 8T SRAM at 80° C. data set 720. Furthermore, the 10T SRAM supports up to 1024 cells per RBL at both 80° C. and 150° C. while the 8T SRAM only supports 1024 cells per RBL at 80° C.

TABLE 1

RBL Sensing Margin by Number of Cells per RBL

| Cells per RBL | 8T; 150° C. | 10T; 150° C. | 8T; 80° C. | 10T; 80° C. |
|---|---|---|---|---|
| 128 | 60.86 | 78.57 | 93.43 | 98 |
| 256 | 36.86 | 63.71 | 82.29 | 90.86 |
| 512 | 11.43 | 46.86 | 67.14 | 82.86 |
| 1024 | 9.71 | 30 | 46.57 | 71.14 |

Figure 8:
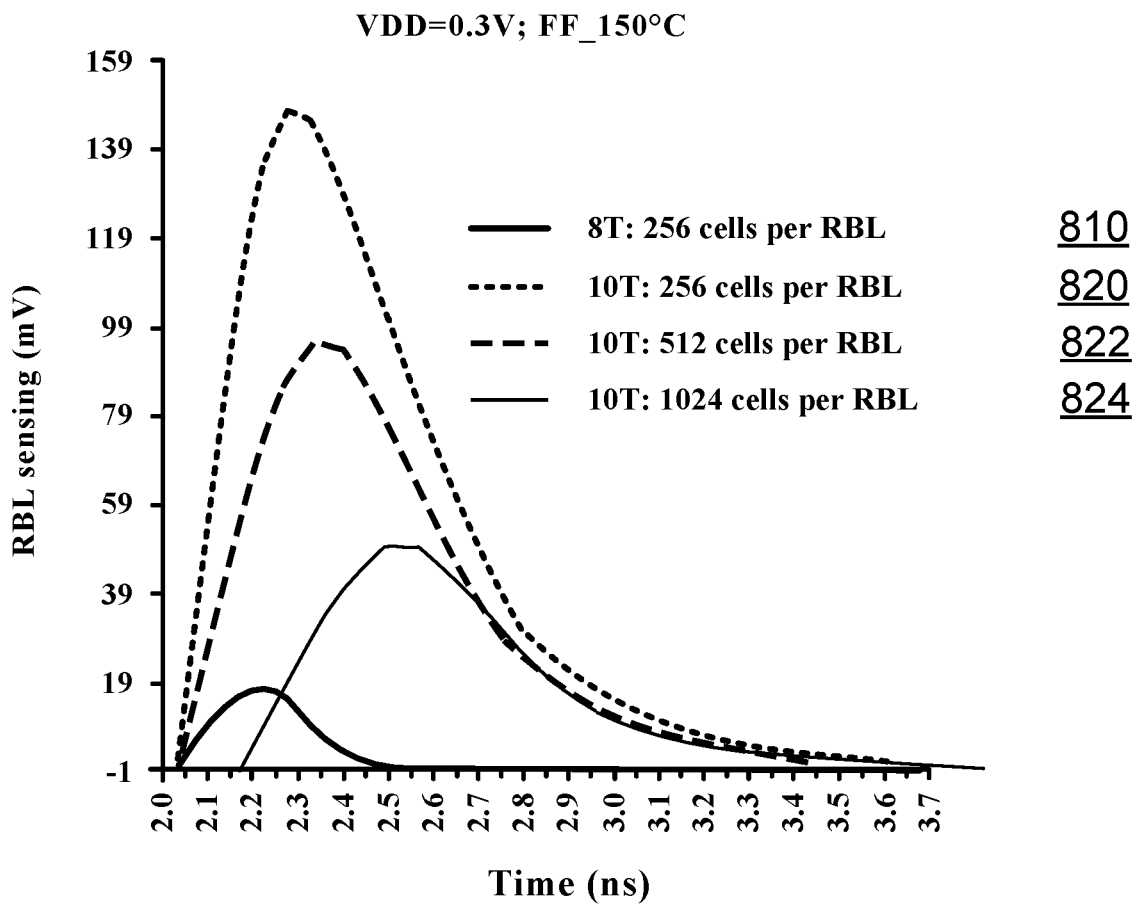
FIG. 8 is a graph illustrating the RBL sensing margin of 8T and 10T SRAM cells over time, according to at least one embodiment.

FIG. 8 is a graph illustrating the RBL sensing margin of 8T and 10T SRAM cells over time. RBL sensing time windows may be critical for single-ended sense amplifier sensing. For data set 810, depicting an 8T SRAM with 256 cells per RBL, the sensing time window is approximately 50 picoseconds with an RBL sensing voltage of 19 mV. In some embodiments, both the 50 ps sensing time window and 19 mV RBL sensing voltage are negligible. By contrast, FIG. 8 shows improved sensing time windows and RBL sensing voltage for 10T SRAM. For data set 820, depicting a 10T SRAM with 256 cells per RBL, the sensing time window is approximately 500 ps and the RBL sensing voltage is 155 mV. Similar improvements are shown through data sets 822 and 824 for 10T SRAM configurations with increased numbers of cells per RBL.

Additional Circuit Configurations

Figure 10:
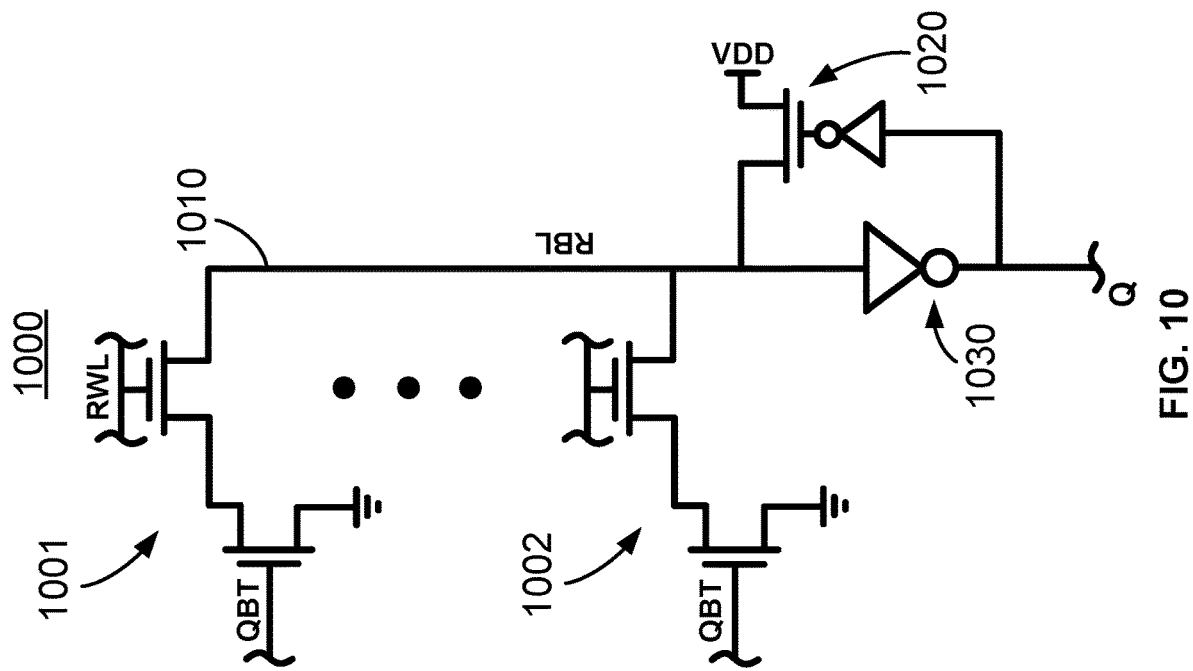
FIG. 10 depicts a circuit diagram illustrating a weak NMOS keeper for a 10T SRAM cell array, according to at least one embodiment.
Figure 9:
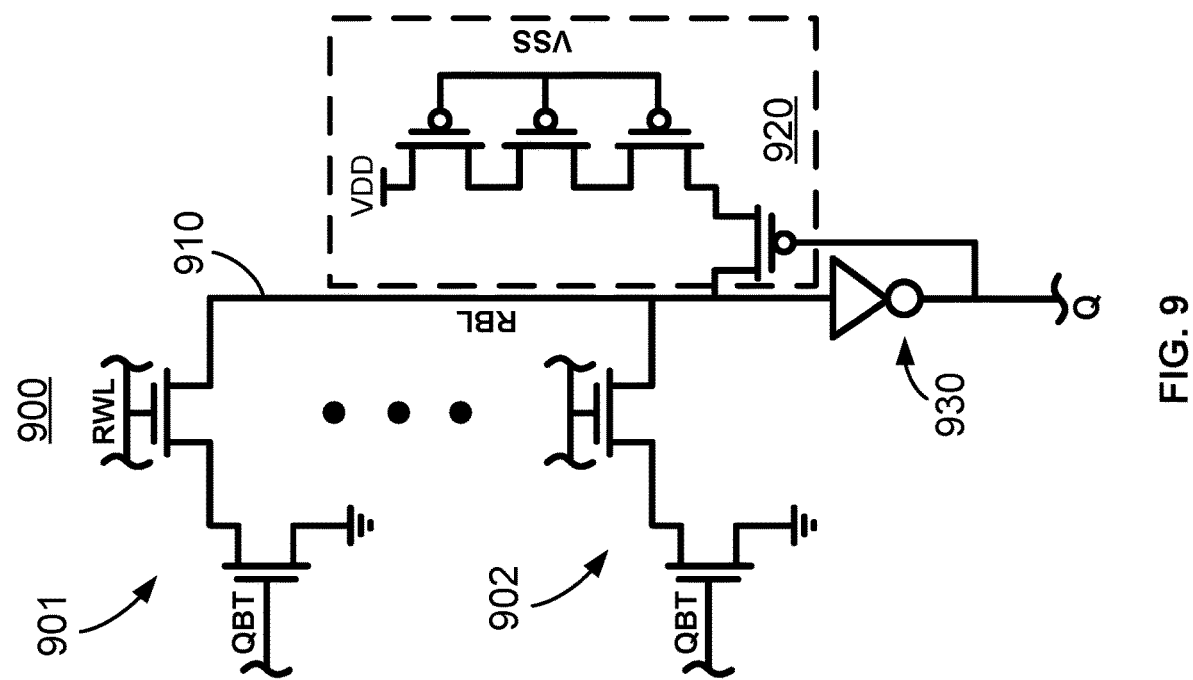
FIG. 9 depicts a circuit diagram illustrating a weak P-type metal-oxide semiconductor (PMOS) keeper for a 10T SRAM cell array, according to at least one embodiment.

In some embodiments, RBL single-ended sensing employs large signal sensing through a sense inverter and a weak transistor keeper (e.g., a weak PMOS keeper). FIGS. 9 and 10 depict circuit diagrams illustrating large signal sensing using a weak PMOS keeper and a weak NMOS keeper, respectively. A weak PMOS keeper may be used to compensate for current leakage through unselected cells of an SRAM cell array. Although FIGS. 9 and 10 depict weak PMOS keeper and NMOS keeper configurations for a 10T SRAM cell array, the weak PMOS keeper and NMOS keeper configurations may also be applied to other SRAM configurations (e.g., an 8T SRAM cell array).

FIG. 9 depicts circuit diagram 900 illustrating weak PMOS keeper 920 for a 10T SRAM cell array. Cells of the 10T SRAM cell array (e.g., cells 901 and 902) are coupled to sense inverter 930 and weak PMOS keeper 920. Although not depicted, more cells may be coupled (e.g., 256 cells coupled). The read port of cells 901 and 902 are configured similar to read port 204 (i.e., QBT drives a transistor of the read port). RBL 910 creates a path coupling the cells to the input of sense inverter 930 and the source of a PMOS of weak PMOS keeper 920. Weak PMOS keeper 920 includes four PMOS transistors. Three of the four PMOS transistors are driven by a VSS voltage at their gates and supply VDD is driven through each of the three PMOS when VSS is low. The fourth PMOS transistor is coupled to the sense inverter, RBL, and the three VSS-driven PMOS such that the fourth PMOS selectively compensates for current leakage when RBL 910 is reading QBT='1.' For example, when RBL 910 is reading logic value '1,' the output of sense inverter is '0,' this acts as the value for the 'Q' and as a driver for the weak PMOS keeper to compensate for leakage current by enabling a path from RBL 910 through 'ON' PMOS transistors to supply voltage VDD. In some embodiments, the configuration depicted in diagram 900 presents a design choice a trade-off between a larger RBL sensing margin and Read '0' timing (e.g., minimizing the time delay to read '0' or discharge RBL to '0'). The Read '0' timing may be worse at a process corner of Slow NMOS Fast PMOS (SF), limiting the minimum VDD or lowest operating voltage. As the minimum VDD increases, the speed of discharging RBL to read '0' may increase.

FIG. 10 depicts circuit diagram 1000 illustrating weak NMOS keeper 1020 for a 10T SRAM cell array. Cells of the 10T SRAM cell array (e.g., cells 1001 and 1002) are coupled to sense inverter 1030 and weak NMOS keeper 1020. Although not depicted, more cells may be coupled. The read port of cells 1001 and 1002 are configured similar to read port 204 (i.e., QBT drives a transistor of the read port). RBL 1010 creates a path coupling the cells to the input of sense inverter 1030 and the source of the NMOS of weak NMOS keeper 1020. The NMOS is further coupled to VDD and driven by the output of an inverter. The inverter, having an input connected to the output of sense inverter 1030, outputs the value of RBL. Weak NMOS keeper 920 compensates for current leakage when RBL 1010 is reading QBT='1' and will not compensate when RBL 1010 is reading QBT='0' (e.g., the NMOS is 'OFF' and RBL does not have a path to VDD). In some embodiments, using a weak NMOS keeper rather than a weak PMOS keeper improves the minimum VDD (e.g., allowing for a lower VDD that is sufficient to operate the SRAM) and Read '0' timing at certain process corners.

Performance Analysis of Additional Circuit Configurations

Figure 11:
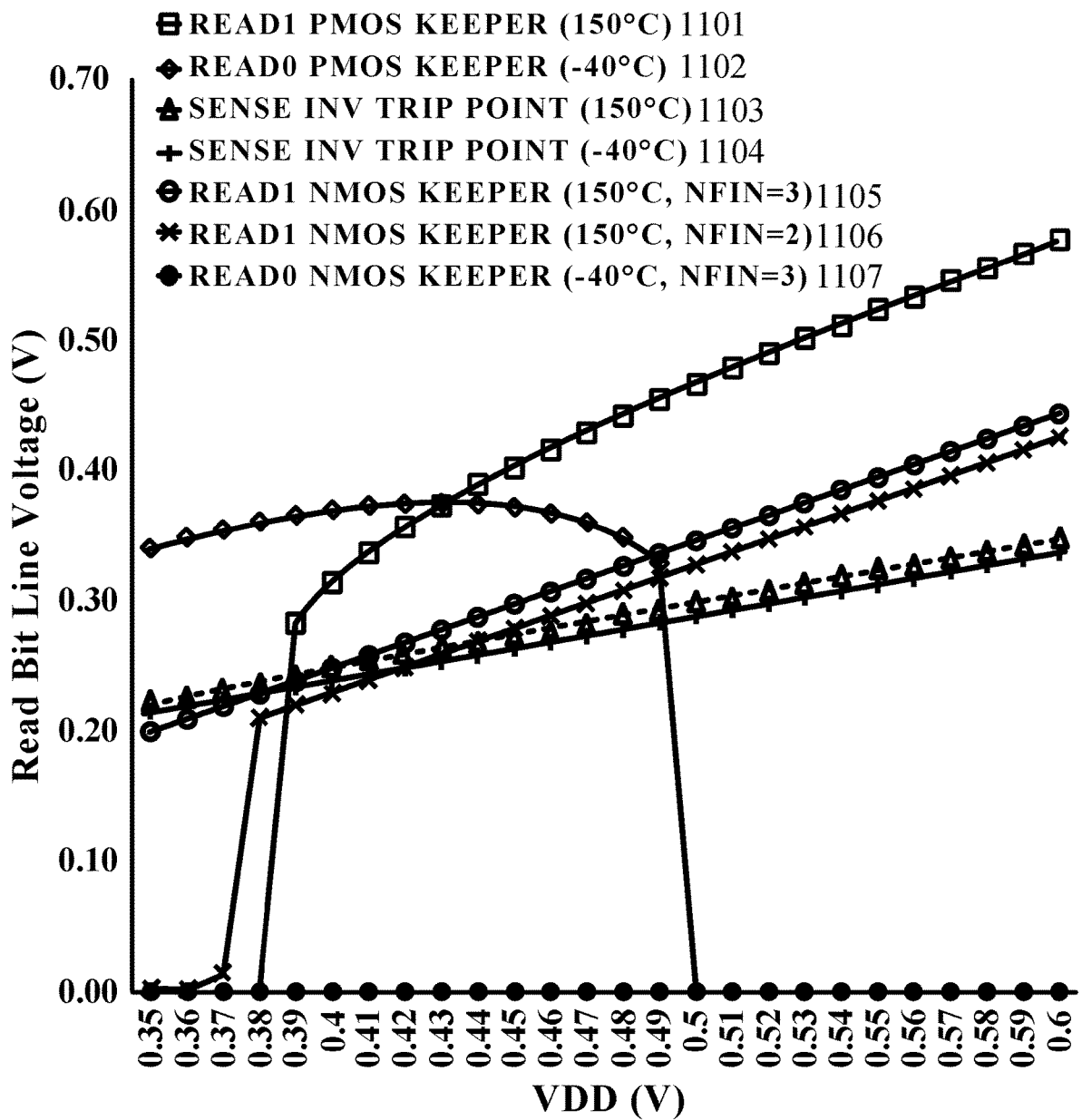
FIG. 11 is a graph illustrating the RBL voltage based on supply voltage, VDD, according to at least one embodiment.
Figure 12:
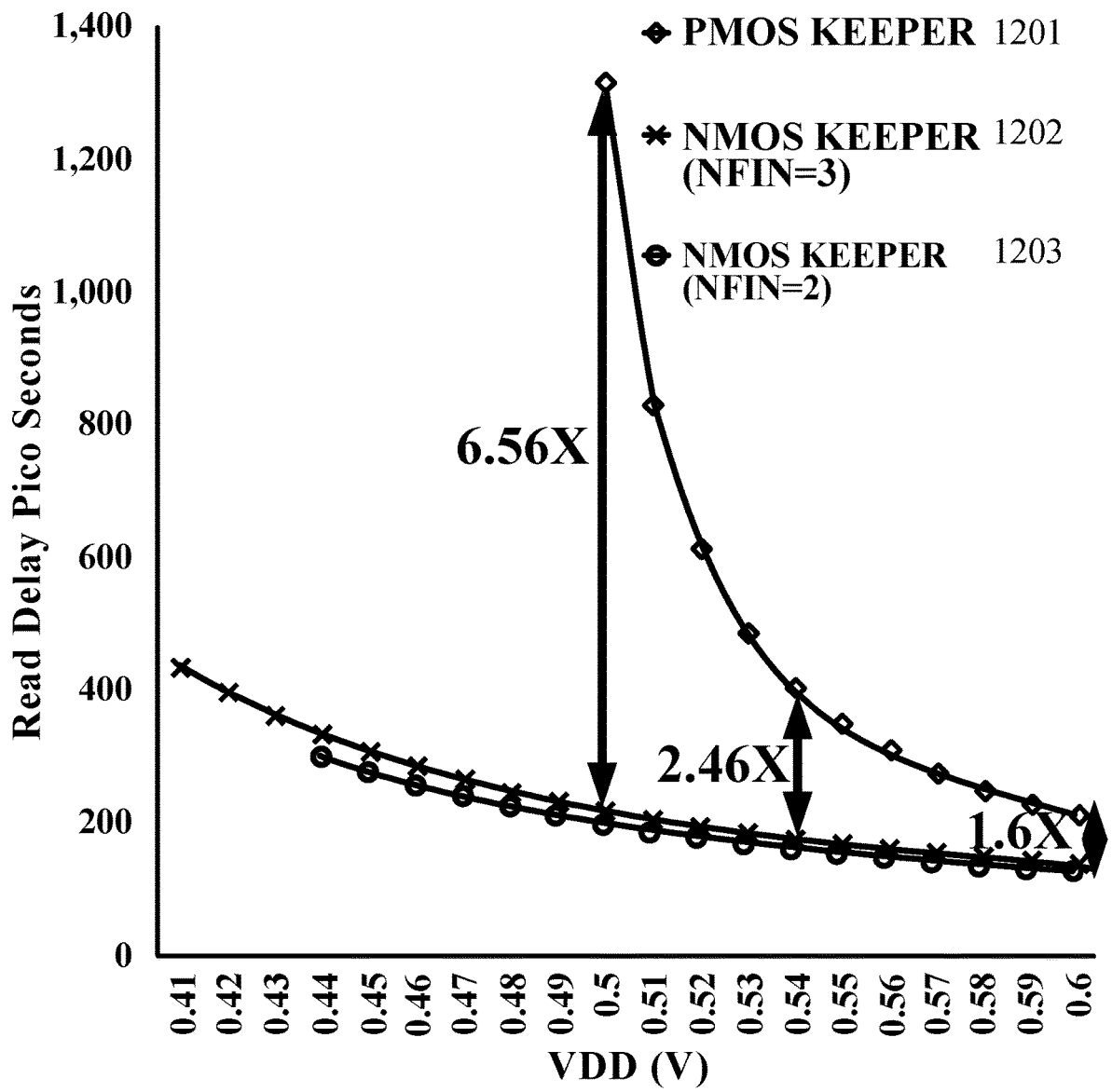
FIG. 12 is a graph illustrating the read delay based on VDD, according to at least one embodiment.

Referring now to FIGS. 11 and 12, illustrated are graphs comparing the performance of weak PMOS keeper and weak NMOS keeper configurations for a 10T SRAM cell array.

The results depicted in FIG. 11 may be obtained through simulation settings of 256 cells per RBL and sweeping VDD from 0.35V to 0.6V for all process corners (i.e., FF, Fast NMOS Slow PMOS (FS), SF, SS, and TT) for both temperature −40° C. and 150° C. In some embodiments, the simulation settings include a 10T SRAM with Low Voltage Threshold (LVT), a sense inverter with LVT (e.g., a minimum size inverter), a weak PMOS keeper with LVT and sizes NFIN=2 (i.e., two FINs for the transistor), and a weak NMOS keeper with Ultra Low Voltage Threshold (ULVT) with NFIN=2 and NFIN=3.

FIG. 11 is a graph illustrating the RBL voltage for various weak PMOS keeper and weak NMOS keeper configurations based on supply voltage, VDD. FIG. 11 depicts embodiments of worst-case process corner simulation results (e.g., worst of FF, SF, FS, SS, and TT) for Read '1' at 150° C., a Read '0' at −40° C., and sense inverter trip points at 150° C. and −40° C. Line 1101 is a worst-case Read '1' at 150° C. for a weak PMOS keeper. In some embodiments, a Read '0' failure occurs when the RBL voltage is above the sense inverter trip point and a Read '1' failure occurs when the RBL voltage is below the sense inverter trip point. At VDD=0.38V, line 1101 is below the worst-case sense inverter trip point at 150° C. (i.e., line 1103), indicating a worst-case Read '1' at 150° C. failure. Line 1102 is a worst-case Read '0' at −40° C. for a weak PMOS keeper. At VDD=0.49V, line 1102 is above the worst-case sense inverter trip point at −40° C. trip point (i.e., line 1104), indicating a worst-case Read '0' at −40° C. failure. Therefore, for weak PMOS keeper, a minimum VDD of 0.5V is limited by worst-case Read '0' at −40° C. (i.e., a minimum of 0.5V is needed to avoid both Read '0' and '1' failures).

Lines 1105-1107 correspond to weak NMOS keeper simulation data. For the RBL voltage of a weak NMOS keeper with NFIN=3 at 150° C., depicted in line 1105, there is a minimum VDD for a worst-case Read '1' of 0.41 V (i.e., the voltage before line 1105 crosses below line 1103). Therefore, a minimum VDD of 0.41V is limited by worst-case Read '1' operation at 150° C. for a weak NMOS keeper with NFIN=3. For the RBL voltage of a weak NMOS keeper with NFIN=2 at 150° C., depicted in line 1106, there is a minimum VDD for a worst-case Read '1' of 0.45 V. Therefore, a minimum VDD of 0.45V is limited by worst-case Read '1' operation at 150° C. for a weak NMOS keeper with NFIN=2. For the RBL voltage of a weak NMOS keeper with NFIN=3 at −40° C., depicted in line 1107, there is no minimum VDD limited by a worst-case Read '0.' In some embodiments, the minimum VDD of the weak PMOS keeper (e.g., limited to 0.5V to perform both Read '0' and '1' functions properly) is larger than the minimum VDD of the weak NMOS keeper (e.g., limited to 0.45V to perform both Read '0' and '1' functions properly). Improvements by 50 mV may be achieved using a weak NMOS keeper configuration as shown in FIG. 11 over a weak PMOS keeper configuration as shown in FIG. 10.

FIG. 12 is a graph illustrating the read delay based on VDD for weak PMOS keeper and weak NMOS keeper configurations as described herein. The simulation results of Read '0' delay at −40° C. is depicted as a function of VDD for three 10T SRAM configurations: a weak PMOS keeper having a minimum VDD of 0.5V (e.g., line 1201), a weak NMOS keeper having NFIN=3 and minimum VDD of 0.41V (e.g., line 1202), and a weak NMOS keeper having NFIN=2 and a minimum VDD of 0.45V (e.g., line 1203). In some embodiments, a Read '0' delay is determined based on a time taken from the RWL to rise to 50% of a maximum voltage charge to a time taken for Q to rise to 80%. The Read '0' delay shown increases faster as the minimum VDD applied decreases for the weak PMOS keeper depicted through line 1201 than the weak NMOS keepers depicted through lines 1202 and 1203. Accordingly, a weak NMOS keeper may improve Read '0' delay at −40° C.

Electronic Design Automation System and Workflow

Figure 13:
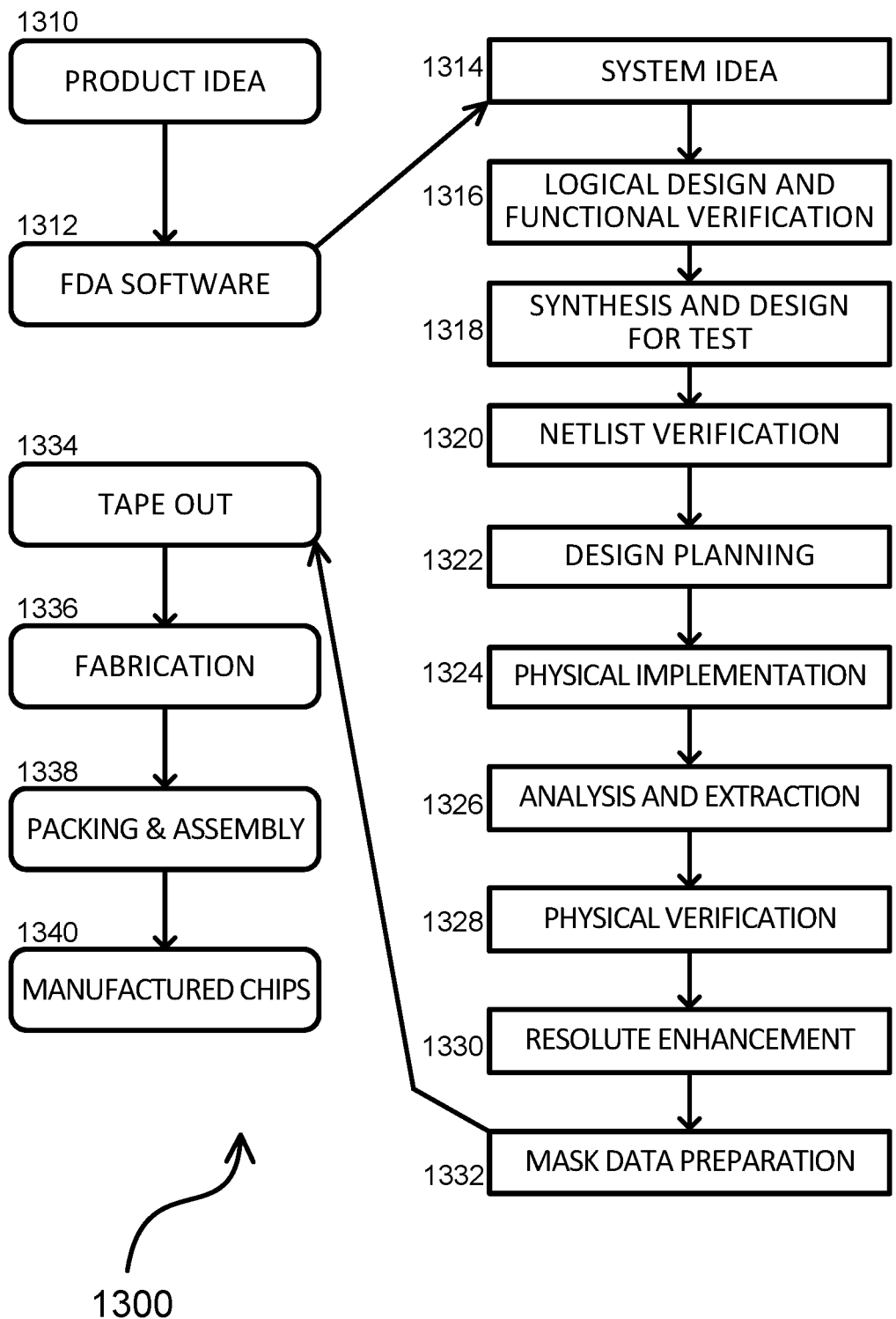
FIG. 13 depicts a flowchart of various operations in the design and fabrication of an integrated circuit, according to at least one embodiment.

FIG. 13 illustrates various processes 1300 performed in the design, verification and fabrication of an item of manufacture such as an integrated circuit using software tools with a computer, and possibly special hardware-assisted tools, to transform and verify design data and instructions that represent the integrated circuit. The term 'EDA' signifies the term 'Electronic Design Automation.' These processes start with the creation of a product idea 1310 with information supplied by a designer, information which is transformed during a process to create an item of manufacture (referred to herein as a design or device) that uses an EDA software tool 1312, which may also be signified herein as EDA software, as a design tool, or a verification tool. When the design is finalized, it can be taped-out 1334, which typically is when artwork (e.g., geometric patterns) for the integrated circuit is sent to a fabrication facility to manufacture the mask set, which is then used to manufacture the integrated circuit. After tape-out, a semiconductor die is fabricated 1336 and packaging and assembly processes 1338 are performed, which result in the finished integrated circuit 1340 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language ('HDL') such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level ('RTL') description, a gate-level description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, which is much used for detailed descriptions of analog-based circuits.

A design process that uses an EDA software tool 1312 includes processes 1314 to 1332, which are described below. This design flow description is for illustration purposes only and is not meant to limit the present disclosure. For example, an actual integrated circuit design may require a designer to perform the design operations in a different sequence than the sequence described herein.

During system design 1314, a designer describes the functionality to be manufactured. The designer can also perform what-if planning to refine the functionality and to check costs, etc. Hardware-software architecture partitioning can occur at this stage.

During logic design and functional verification 1316, modules in the circuit are specified in one or more hardware description languages, or HDLs, and the design in HDL is checked for functional accuracy, that is, to match the requirements of the specification of the circuit or system being designed to ensure that the design produces the correct outputs. For example, modules in the circuit corresponding to SRAM memory arrays may be checked for functional accuracy to verify proper Read '0' and Read '1' operations with data-independent leakage. In one embodiment, transistor keeper modules (e.g., a weak NMOS keeper configuration) are checked for functional accuracy to verify proper compensation for RBL current leakage. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification.

During synthesis and design for test 1318, HDL code is translated to a netlist. This netlist can be optimized for the target technology. Additionally, tests can be designed and implemented to check the finished integrated circuit.

During netlist verification 1320, the netlist is checked for compliance with timing constraints and for correspondence with the HDL code.

During design planning 1322, an overall floor plan for the integrated circuit is constructed and analyzed for timing and top-level routing.

During layout implementation 1324, the physical placement (positioning of circuit elements such as transistors or capacitors) and routing (connection of the same by a plurality of conductors) occurs, as can selection of library cells to perform specific logic functions.

During analysis and extraction 1326, the circuit function is verified at the layout level, which permits refinement of the layout design.

During physical verification 1328, the layout design is checked to ensure correctness for manufacturing constraints such as DRC constraints, electrical constraints, lithographic constraints, and circuitry function matching the HDL design specification.

During resolution enhancement 1330, geometric manipulations of the layout are performed to improve manufacturability of the design.

During tape-out, data is created to be used (after lithographic enhancements are applied if appropriate) for production of lithography masks.

During mask-data preparation 1332, the 'tape-out' data is used to produce lithography masks that are used to produce finished integrated circuits.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 1312.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

General Computer System Applications

FIGS. 14A, 14B and 14C are simplified block diagrams of a computer system suitable for use with embodiments of the technology, as well as circuit design and circuit embodiments of the technology.

In FIG. 14A, computer system 1410 typically includes at least one computer or processor 1414 which communicates with a number of peripheral devices via bus subsystem 1412. Typically, the computer can include, or the processor can be, any of a microprocessor, graphics processing unit, or digital signal processor, and their electronic processing equivalents, such as an Application Specific Integrated Circuit ('ASIC') or Field Programmable Gate Array ('FPGA'). The terms 'processor' and 'computer' are further defined below. These peripheral devices may include a storage subsystem 1424, comprising a memory subsystem 1426 and a file storage subsystem 1428, user interface input devices 1422, user interface output devices 1420, and a network interface subsystem 1416. The input and output devices allow user interaction with computer system 1410.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine capable of executing instructions (sequential or otherwise) that specify actions to be taken by that machine.

The computer system typically includes an operating system, such as Microsoft's Windows, Sun Microsystems's Solaris, Apple Computer's MacOS, Linux or Unix. The computer system also typically can include a Basic Input/Output System (BIOS) and processor firmware. The operating system, BIOS and firmware are used by the processor to control subsystems and interfaces connected to the processor.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 1410 depicted in FIG. 14A is intended only as one example for purposes of illustrating the preferred embodiments. Many other configurations of computer system 1410 are possible having more or less components than the computer system depicted in FIG. 14A.

Network interface subsystem 1416 provides an interface to outside networks, including an interface to communication network 1418, and is coupled via communication network 1418 to corresponding interface devices in other computer systems or machines. Communication network 1418 may comprise many interconnected computer systems, machines and communication links. These communication links may be wireline links, optical links, wireless links, or any other devices for communication of information. Communication network 1418 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 1422 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term 'input device' is intended to include all possible types of devices and ways to input information into computer system 1410 or onto communication network 1418. User interface input devices typically allow a user to select objects, icons, text and the like that appear on some types of user interface output devices, for example, a display subsystem.

User interface output devices 1420 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term 'output device' is intended to include all possible types of devices and ways to output information from computer system 1410 to the user or to another machine or computer system.

Memory subsystem 1426 typically includes a number of memories including a main random-access memory ('RAM') 1430 (or other volatile storage device) for storage of instructions and data during program execution and a read only memory ('ROM') 1432 in which fixed instructions are stored. File storage subsystem 1428 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 1428.

Bus subsystem 1412 provides a device for letting the various components and subsystems of computer system 1410 communicate with each other as intended. Although bus subsystem 1412 is shown schematically as a single bus, alternative embodiments of the bus subsystem may use multiple busses. For example, RAM-based main memory can communicate directly with file storage systems using Direct Memory Access ('DMA') systems.

FIG. 14B depicts a memory 1440 such as a non-transitory, computer readable data and information storage medium associated with file storage subsystem 1428, and/or with network interface subsystem 1416, and can include a data structure specifying a circuit design. The memory 1440 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 14C signifies an integrated circuit 1490 created with the described technology that includes one or more cells selected, for example, from a cell library.

Additional Configuration Considerations

Example benefits and advantages of the disclosed configurations include data-independent RBL current leakage for 10T SRAM cell arrays (e.g., during standby operation). Because the leakage is data-independent, the design of the 10T SRAM cell array may not be limited by the number of bit cells per bit line. The bit line sensing margin may also increase due to a decrease in RBL leakage in the read ports of cells. FIGS. 5-8 are simulation results that show these advantages (e.g., increased sensing time windows for the 10T SRAM configuration).

The weak transistor keepers described herein have benefits and advantages as well. A read sensing margin may be limited by an on-to-off current ratio at low voltages, which in turn, limits the minimum supply voltage, VDD MIN. To improve the read sensing margin, a weak PMOS keeper may be used to compensate for bit line leakage in large signal sensing. In some embodiments, the sizing of a weak PMOS keeper is affected by a desired trade-off between read sensing margin and Read '0' timing and by a Read '0' penalty at a SF process corner. In some embodiments, a weak NMOS keeper improves both the read sensing margin and the Read '0' timing of a weak PMOS keeper for large signal sensing. As shown in FIG. 10, a weak NMOS keeper as described herein can improve VDD MIN by 50 mV for NFIN=2 and by 90 mV for NFIN=3. Further improvements are shown in FIG. 11, where the Read '0' delay is shown to improve by approximately 163% for VDD=0.6V, 140% for VDD=0.54V, and 115% for VDD=0.5V.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, nonvolatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for SRAM cell array operations (e.g., Read operations) with data-independent current leakage and compensated current leakage (e.g., using a weak NMOS keeper) through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. An integrated circuit for storing data, comprising:
   a memory cell array comprising a bit cell having a static random access memory architecture, wherein the bit cell comprises i) a write port and ii) a read port having a plurality of transistors; and
   a plurality of wordlines and bitlines arranged in rows and columns in the memory cell array such that the plurality of wordlines and bitlines are coupled to the memory cell array,
   wherein a first transistor of the plurality of transistors is coupled to at least i) a first wordline of the plurality of wordlines, ii) a first bitline of the plurality of bitlines, and iii) a second transistor of the plurality of transistors,
   wherein the second transistor is further coupled to at least a third transistor of the plurality of transistors and a fourth transistor of the plurality of transistors,
   wherein the third transistor is further coupled to at least the write port and a second wordline of the plurality of wordlines, and
   wherein the fourth transistor is further coupled to at least the second wordline.

2. The integrated circuit of claim 1, wherein a leakage current during a Read '0' operation through at least one selected cell of the memory cell array is substantially similar to a leakage current during a Read '1' operation through the at least one selected cell.

3. The integrated circuit of claim 1, wherein the logic value carried on the second wordline is the inverse of the logic value carried on the first wordline.

4. The integrated circuit of claim 1, wherein during a standby operation, a logic value '0' drives the second transistor.

5. The integrated circuit of claim 1,
   wherein the first bitline is further coupled to a weak NMOS keeper, the weak NMOS keeper comprising an inverter and an NMOS transistor,
   wherein the output of the inverter is accessible for a memory read operation, and
   wherein the NMOS transistor is further coupled to a supply voltage source.

6. The integrated circuit of claim 5,
   wherein the NMOS transistor and three additional NMOS transistors are connected in serial, and
   wherein, for a Read '1' operation, a minimum supply voltage (VDD MIN) is approximately 0.45V.

7. The integrated circuit of claim 5,
   wherein the NMOS transistor and five additional NMOS transistors are connected in serial, and
   wherein, for a Read '1' operation, VDD MIN is approximately 0.41V.

8. The integrated circuit of claim 1, wherein a sensing time window of the first bitline is at least 0.5 nanosecond (ns).

9. The integrated circuit of claim 1, wherein a sensing voltage of the first bitline is within a range of 25% to 80% of a supply voltage under operation at 150° C.

10. A non-transitory computer-readable storage medium storing a digital representation of an integrated circuit for storing data, the integrated circuit comprising:
    a memory cell array comprising a bit cell having a static random access memory architecture, wherein the bit cell comprises i) a write port and ii) a read port having a plurality of transistors; and
    a plurality of wordlines and bitlines arranged in rows and columns in the memory cell array such that the plurality of wordlines and bitlines are coupled to the memory cell array,
    wherein a first transistor of the plurality of transistors is coupled to at least i) a first wordline of the plurality of wordlines, ii) a first bitline of the plurality of bitlines, and iii) a second transistor of the plurality of transistors,
    wherein the second transistor is further coupled to at least a third transistor of the plurality of transistors and a fourth transistor of the plurality of transistors,
    wherein the third transistor is further coupled to at least the write port and a second wordline of the plurality of wordlines, and
    wherein the fourth transistor is further coupled to at least the second wordline.

11. The integrated circuit of claim 10, wherein a leakage current during a Read '0' operation through at least one selected cell of the memory cell array is substantially similar to a leakage current during a Read '1' operation through the at least one selected cell.

12. The integrated circuit of claim 10, wherein the logic value carried on the second wordline is the inverse of the logic value carried on the first wordline.

13. The integrated circuit of claim 10, wherein during a standby operation, a logic value '0' drives the second transistor.

14. The integrated circuit of claim 10,
wherein the first bitline is further coupled to a weak NMOS keeper, the weak NMOS keeper comprising an inverter and an NMOS transistor,
wherein the output of the inverter is accessible for a memory read operation, and
wherein the NMOS transistor is further coupled to a supply voltage source.

15. The integrated circuit of claim 14,
wherein the NMOS transistor and three additional NMOS transistors are connected in serial, and
wherein, for a Read '1' operation, VDD MIN is 0.45V.

16. The integrated circuit of claim 10, wherein a sensing time window of the first bitline is at least 0.5 ns.

17. The integrated circuit of claim 10, wherein a sensing voltage of the first bitline is within a range of 25% to 80% of a supply voltage under operation at 150° C.

18. An integrated circuit for storing data, comprising:
a memory cell array comprising a bit cell having a static random access memory architecture, wherein the bit cell comprises a write port and a read port; and
a plurality of wordlines and bitlines arranged in rows and columns in the memory cell array such that the plurality of wordlines and bitlines are coupled to the memory cell array,
wherein a bitline of the plurality of bitlines is coupled to at least a sense inverter and a weak NMOS keeper, the weak NMOS keeper comprising an inverter and an NMOS transistor, and
wherein the output of the sense inverter is accessible for a memory read operation.

19. The integrated circuit of claim 18, wherein the memory cell array is an 8T SRAM cell array.

20. The integrated circuit of claim 18, wherein the memory cell array is a 10T SRAM cell array.

* * * * *